United States Patent
Shamoun

(10) Patent No.: US 7,517,437 B2
(45) Date of Patent: Apr. 14, 2009

(54) RF POWERED TARGET FOR INCREASING DEPOSITION UNIFORMITY IN SPUTTERING SYSTEMS

(75) Inventor: Bassam Shamoun, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 102 days.

(21) Appl. No.: 11/392,026

(22) Filed: Mar. 29, 2006

(65) Prior Publication Data
US 2007/0227876 A1 Oct. 4, 2007

(51) Int. Cl.
*C23C 14/54* (2006.01)
(52) U.S. Cl. .............. 204/298.08; 204/298.11; 204/192.11; 156/345.35; 156/345.36; 156/345.43; 156/345.44; 118/723 R
(58) Field of Classification Search ............. 156/345, 156/643, 646, 345.47, 345.35–345.36, 345.43–345.44; 438/714, 30, 710, 10, 14, 11; 118/715–725; 257/48, 428; 361/225; 204/298.32, 192.23, 204/192.12, 192.13; 60/202; 702/65; 315/111.21
See application file for complete search history.

(56) References Cited

U.S. PATENT DOCUMENTS

| | | | | |
|---|---|---|---|---|
| 3,185,849 A * | 5/1965 | Hoyer et al. | ................. | 376/116 |
| 4,362,632 A * | 12/1982 | Jacob | ..................... | 422/186.04 |
| 4,887,005 A | 12/1989 | Rough et al. | | |
| 5,292,399 A * | 3/1994 | Lee et al. | ..................... | 438/716 |
| 5,314,603 A * | 5/1994 | Sugiyama et al. | ...... | 204/298.32 |
| 5,332,880 A | 7/1994 | Kubota et al. | | |
| 5,478,429 A | 12/1995 | Komino et al. | | |
| 6,117,279 A * | 9/2000 | Smolanoff et al. | ...... | 204/192.12 |
| 6,162,332 A | 12/2000 | Chiu | | |
| 6,280,563 B1 * | 8/2001 | Baldwin et al. | ......... | 156/345.48 |
| 6,313,583 B1 * | 11/2001 | Arita et al. | .............. | 315/111.21 |
| 6,614,051 B1 * | 9/2003 | Ma | .............................. | 257/48 |
| 6,695,954 B2 * | 2/2004 | Hong | ..................... | 204/192.12 |
| 6,740,842 B2 * | 5/2004 | Johnson et al. | ......... | 219/121.54 |
| 6,858,112 B2 | 2/2005 | Flamm et al. | | |
| 6,971,391 B1 | 12/2005 | Wang et al. | | |
| 2002/0025685 A1 * | 2/2002 | Huang et al. | ................. | 438/714 |
| 2003/0019581 A1 * | 1/2003 | Drewery | ................ | 156/345.43 |
| 2003/0029567 A1 * | 2/2003 | Dhindsa et al. | ......... | 156/345.47 |
| 2004/0210407 A1 * | 10/2004 | Quon et al. | .................... | 702/65 |
| 2004/0231972 A1 | 11/2004 | Laptev et al. | | |
| 2006/0075739 A1 * | 4/2006 | Wiseman | ..................... | 60/202 |
| 2006/0112878 A1 * | 6/2006 | Ni et al. | .................... | 118/723 E |
| 2006/0292727 A1 * | 12/2006 | Motokawa et al. | ............ | 438/30 |
| 2007/0076344 A1 * | 4/2007 | Hamaishi et al. | ............ | 361/225 |

OTHER PUBLICATIONS

Search Report and Written Opinion for PCT/US07/61630 (10735 PCT) dated Jan. 9, 2009.

* cited by examiner

*Primary Examiner*—Nam X Nguyen
*Assistant Examiner*—Bach T Dinh
(74) *Attorney, Agent, or Firm*—Patterson & Sheridan LLP

(57) ABSTRACT

A method and apparatus for sputter depositing a film on a substrate is disclosed. By providing a superimposed RF bias over a DC bias, plasma ionization is increased. In order to increase the resistive load across the substrate, an impedance circuit is provided between the substrate and the susceptor. The impedance circuit allows an insulating substrate to effectively function as an anode and connect to ground.

19 Claims, 3 Drawing Sheets

RF POWERED TARGET FOR INCREASING DEPOSITION UNIFORMITY IN SPUTTERING SYSTEMS

BACKGROUND OF THE INVENTION

1. Field of the Invention

Embodiments of the present invention generally relate to substrate processing apparatuses and methods such as apparatuses and methods for flat panel display processing (i.e. LCD, OLED, and other types of flat panel displays), semiconductor wafer processing, and solar panel processing.

2. Description of the Related Art

In sputtering large area substrates (i.e. flat panel displays, solar cells, etc.), some problems are encountered during DC bias of a target including non-uniform deposition and low target utilization. Therefore, there is a need for an improved sputtering apparatus and method.

SUMMARY OF THE INVENTION

The present invention generally involves plasma distribution within a sputtering apparatus and methods for sputtering within the apparatus.

In a first embodiment, a plasma apparatus is disclosed. The apparatus has a first impedance circuit coupled between ground and the plasma and a second impedance circuit coupled between the plasma and a susceptor.

In a second embodiment, a method of sputtering within a sputtering apparatus is disclosed. The method comprises providing a substrate, providing a susceptor for holding the substrate, controlling the impedance between the substrate and the susceptor, and sputtering to deposit a layer on the substrate.

In a third embodiment, a method of sputtering within a sputtering apparatus is disclosed. The method comprises providing a substrate, providing a chamber shield within a sputtering chamber, forming a plasma in the sputtering chamber by sputtering material from a sputtering target, increasing impedance between the plasma and the chamber shield, increasing a voltage drop between the plasma and the substrate, and depositing a layer on the substrate.

In a fourth embodiment, a sputtering apparatus is disclosed, the apparatus has a sputtering target, a susceptor, a first impedance circuit coupled between a substrate and the susceptor, and a tuning circuit between the susceptor and ground.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
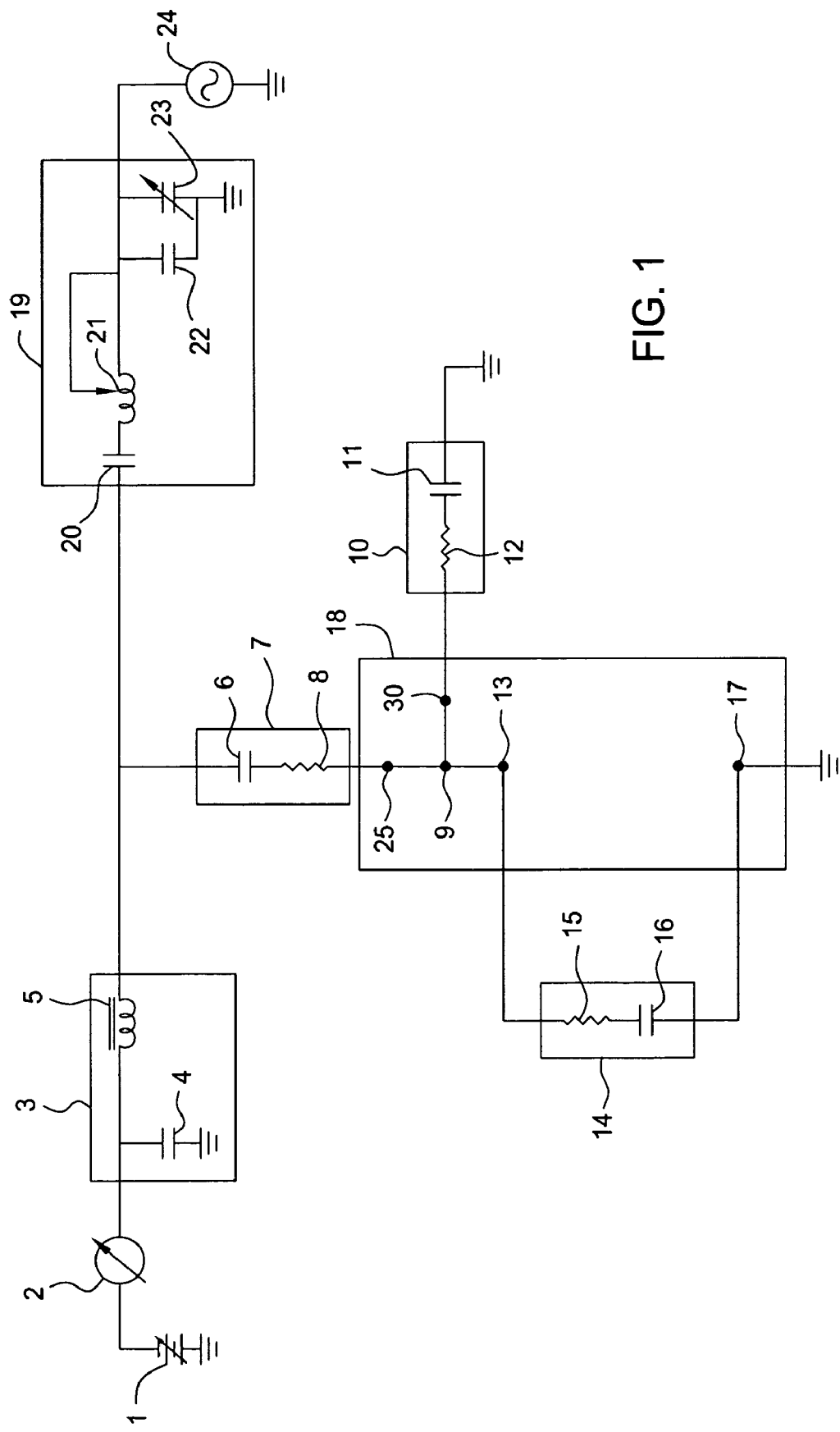
FIG. 1 is a circuit diagram showing an impedance circuit between the plasma and the wall.

The present invention involves superimposing an RF bias over a DC bias to a target of a sputtering chamber while reducing the resistive load on a substrate. The invention is applicable to all substrates such as flat panel displays, solar cells, semiconductors, etc. Examples of flat panel display substrates that can be processed using the instant invention include large area substrates such as glass substrates, polymer substrates, or other suitable large area substrate capable of being used to form flat panel displays.

Any conventional sputtering gas can be utilized to practice the instant invention. Typical sputtering gases include inert gases such as argon, xenon, krypton and reactive gases such as nitrogen and oxygen. Additionally, any conventional sputtering target material can be used such as metal and insulative targets that are sputtered with or without a magnetron.

An exemplary apparatus in which to practice the instant invention is the 40K AKT® PVD chamber provided by AKT, Inc., a subsidiary of Applied Materials, Inc., Santa Clara, Calif. Of course, the invention can be practiced in a cluster processing system, an in-line processing system, a stand alone processing system or any other suitable processing system.

There are two groups of electrons that are ejected from a sputtering target that are responsible for maintaining an ionization process. The first group of electrons are the primary electrons. The primary electrons enter the plasma after being sputtered from the cathode target with a nearly full dark space potential (i.e. the negative potential with respect to the plasma). The primary electrons are created by forming an electric field (E-field) when applying the DC bias to the target. The primary electrons decay in energy mainly because of inelastic collisions within the plasma.

The second group of electrons are secondary electrons. The secondary electrons are emitted from the target with an energy of less than about 30 eV, but are accelerated by the cathode dark space (CDS) potential. The secondary electrons are influenced by an applied magnetic field B and move perpendicular to the field line in a closed loop configuration created by an ExB drift. The secondary electrons are important in sustaining the ionization within the plasma. The secondary electrons orbit the target many times and lose their energy by colliding with other atoms or electrons and then ionizing. When the energy of the secondary electrons drops below a certain level, the secondary electrons are collected by an anode.

Without an anode, a space charge develops that changes the electric field within the plasma volume. The electric field within the plasma volume changes because the density of the secondary electrons continues to grow larger. The space charge may have a negative impact upon the ion flux to the target. By decreasing the flux to the target, the sputtering rate will decrease. The space charge can also change the plasma density and cause the plasma to become less neutral. For large area substrates, not having an anode near the center of the target results in films thinner at the center as compared to the areas away from the center. The reason for the uneven film formation is that the chamber wall acts as an anode.

When an anode is used, the secondary electrons can be collected and space charge will not develop. Placing an anode between the target and the substrate will improve the resistive load on the substrate (RS) so that it is uniform. The placement of the anode will affect the RS uniformity. Ideally, the RS uniformity should be <15%. When anode rods are placed between a target and a substrate in an area near the center of the target and perpendicular to the magnetic field lines, the RS uniformity will be improved. The RS uniformity is improved because the path length of the secondary electrons is increased by the magnetic field, thus increasing the ionization.

A substrate within the sputtering chamber is usually considered to be an anode when no bias is applied to it. In the case of a glass substrate, the substrate will not usually be an effective anode when the susceptor is connected to ground. Because the substrate is an insulative substrate, the path to ground through the substrate does not exist because the substrate covers the susceptor. Therefore, the substrate is not nearly as effective as the anode when compared to the chamber wall. Because the substrate is not as effective an anode as the chamber wall, a layer will deposit thinner at the center as opposed to the edge, especially for large area substrates such as flat panel display substrates. The layer will be thinner at the center because the plasma density will be non-uniform across the free space between the target and the substrate.

Anodes in the path between the target and the substrate are not desirable because anodes within the line of sight path can cause flaking. Instead of anodes within the line of sight path between the target and the substrate, RF biasing the target is an attractive alternative. RF bias is an attractive alternative because it can be tuned to match the plasma. Additionally, the oscillatory nature of the RF electric field will cause electrons to be more readily retained within the plasma so that their energy increases. The energy of the electrons increases by a wave-coupling process so that the plasma density and sputtering rate increase.

Figure 3:
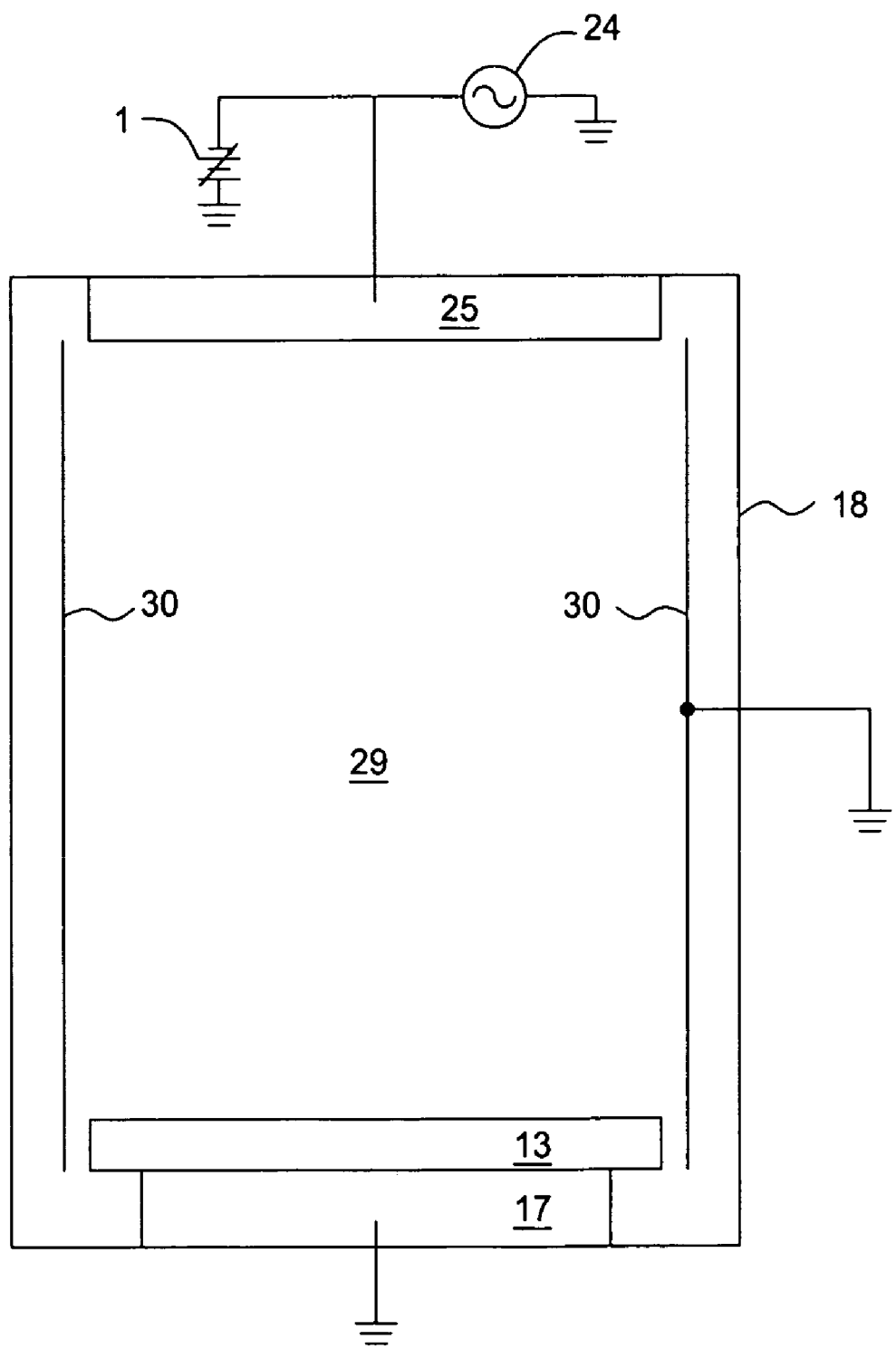
FIG. 3 is a schematic drawing of a sputtering apparatus.

DC power typically creates the plasma discharge in a sputtering chamber at an appropriate chamber pressure. By superimposing an RF bias over the DC bias, the magnetron plasma discharge will control the incident ion energy on the target. FIG. 3 shows a schematic representation of a target 25 spaced from a substrate 13. A chamber shield 30 lines the processing region 29. The substrate 13 is provided on a susceptor 17. The susceptor 17, chamber shield 30, and the chamber wall 18 are grounded. Between the target 25 and the substrate 13 is the processing region 29. The target 25 has an RF bias from an RF signal generator 24 superimposed over a DC bias from a DC power supply 1.

It will be necessary for the DC power to pass through a low pass filter 3 and for the RF bias to pass through a matching circuit 19 (see FIG. 1). Because of the RF bias, self-biases will generate at the surface of the target 25, the surface of the chamber shield 30, and the surface of the susceptor 17. Thus, the RF coupling across the dark spaces could be considered capacitive coupling. Therefore, the RF current through the dark spaces is an electron displacement current.

By applying an RF bias to the target, an additional source of ionization for the secondary electrons ejected from the target is present. As noted above, the DC bias on the target is the main source for the plasma discharge. The additional source is electrons in the glow space that are heated as a consequence of the electrons oscillating in the RF field and making collisions with gas atoms. The gas atoms then acquire sufficient energy to cause ionization. If the ionization source is larger than the target source (i.e. if the secondary electrons produced is larger than that produced by the DC bias), then the DC bias will not be necessary to maintain the glow discharge. The DC bias may, however, be necessary at a much lower power than initially applied to control the rate of the sputtering gas ions that bombard the target. The amount that the DC bias will be reduced depends upon the RF bias. By reducing the DC bias, arcing can be avoided.

If the capacitance across the substrate is relatively high, then the RF voltage across it is negligible. In other words, a high capacitance means a low capacitance impedance. During the ionization, the plasma oscillates. The plasma oscillation promotes electron migration across the magnetic field and into the plasma volume. The plasma oscillation frequency can be measured with an electrostatic probe at select regions of the sputtering chamber. The plasma density could also be measured with the probe.

The low pass filter 3 comprises an RF choke 5 and a tuning capacitor 4. Along the DC power line, the current is measured at measuring point 2. The DC power is supplied from a DC power supply 1. The low pass filter 3 is beneficial because it protects the DC power supply 1 from the RF bias. The DC low pass filter 3 allows the RF bias to be stably applied.

The matching circuit 19 comprises a stepped inductor 21 and a tuning capacitor 23. The matching circuit 19 also has two other capacitors 20, 22. The capacitor 22 and the tuning capacitor 23 are connected in parallel. The capacitor 20 is connected in series with the stepped inductor 21. The RF bias is supplied from an RF signal generator 24.

FIG. 1 shows a circuit diagram that includes the low pass filter 3 and the matching circuit 19 discussed above. FIG. 1 also includes an impedance circuit 10 between the plasma 9 and ground through the chamber shield 30 and chamber wall 18 as well as an impedance circuit 14 between the substrate 13 and the susceptor 17.

The impedance through the glow space between the target and the plasma can be controlled by the RF matching circuit 19 and the impedance circuit 7. The impedance circuit 7 comprises a resistor 8 and a capacitor 6 connected in series between the target 25 and the junction of the RF signal generator 24 and the DC power supply 1.

The impedance through the chamber shield 30 can be controlled with an impedance circuit 10 for the chamber shield 30. The impedance circuit 10 is between ground and the plasma 9 through the chamber wall 18 and the chamber shield 30. The chamber wall 18 will of course be grounded. The impedance circuit 10 comprises a resistor 12 and a capacitor 11 connected in series. The impedance is controlled by the density of the electrons and their mobility in the radial direction. By increasing the impedance to through the chamber shield 30 from the RF signal generator 24, the voltage drop between the glow space and the substrate 13 is increased. By increasing the pressure and/or using the axial magnetic field, impedance at the chamber shield 30 can also be increased.

The impedance through the substrate 13 can be controlled with an impedance circuit 14. The impedance circuit 14 comprises a resistor 15 and a capacitor 16 connected in series. The impedance circuit 14 between the substrate 13 and the susceptor 17 allows an insulative substrate to effectively act as an anode. As noted above, an anode will collect the secondary electrons. By having the substrate 13 as an anode, the resistive load on the substrate will approach uniformity.

Much like the anode in front of the target 25, the plasma 9 will be uniform and the film deposited will be uniformly deposited. The substrate 13 as the anode provides the added benefit of not blocking any line of sight path between the target 25 and the substrate 13. Therefore, the impedance circuit 14 helps create a uniform plasma 9, a uniform resistive load across the substrate 13, and uniform deposition on the substrate 13.

The impedance to the ground of the substrate 13 is a function of the system geometry. It is best to reduce the impedance to the ground of the substrate 13 in order to increase the RF current flow. By inserting a suitable network between the substrate 13 and the ground, both the magnitude and the phase of the impedance changes can be controlled.

Figure 2:
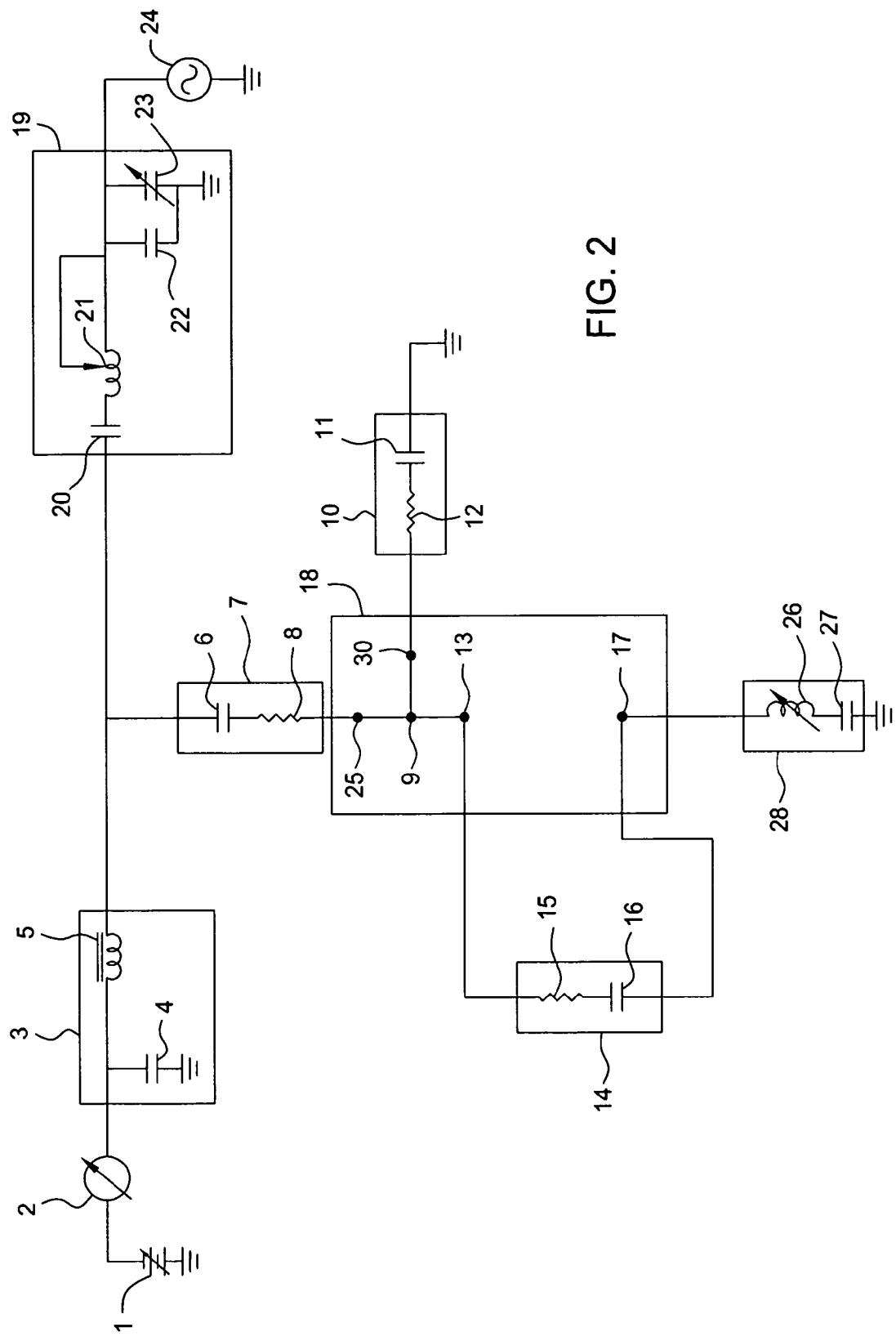
FIG. 2 is a circuit diagram showing a tuning circuit between the susceptor and ground.

A good network for controlling the impedance changes is a tuning circuit 28. The tuning circuit 28 is inserted between the susceptor 17 and ground as shown in FIG. 2. The tuning circuit 28 comprises a variable inductor 26 and a capacitor 27 connected in series. Without the tuning circuit 28, it is possible that most of the RF current will flow to the wall because the wall may have lower impedance. Therefore, if the inductance of the tuning circuit 28 is increased, its reactance will partially cancel the capacitive reactance in the chamber and lower the net impedance between the plasma 9 and ground through the substrate 13. As noted above, the lower the impedance between the plasma 9 and the substrate 13, the better the substrate 13 functions as an anode.

Determining Power Supply Parameters

The DC and RF power supplied to the target 25 can be determined on a case by case basis. The amount of DC bias and RF bias can be determined by following a simple procedure described below.

Initially, the RF bias should be connected to the system, but not applied. The DC bias is then applied and gradually increased until the glow discharge is ignited. Once the glow discharge is ignited, the DC voltage can be turned off. The RF bias can then be applied at a predetermined wattage (i.e. 13.56 MHz) and the DC bias can be re-applied. The DC bias should then be gradually increased in steps. At each step, the RF matching circuit will need to be adjusted so that the reflected power is minimized and the plasma discharge is sustained.

The DC bias will have a threshold below which no plasma discharge can be established, so the DC bias threshold needs to be discovered. The RF bias should then be increased in steps so that discharge data can be collected. By experimenting with the DC step increase and the RF step increase, the correct combination of DC bias and RF bias can be discovered to produce the desired current density.

While the foregoing is directed to embodiments of the present invention, other and further embodiments of the invention may be devised without departing from the basic scope thereof, and the scope thereof is determined by the claims that follow.

The invention claimed is:

1. A plasma apparatus comprising:
a plasma processing chamber having a chamber shield, a sputtering target and a substrate;
a first impedance circuit coupled between ground and the chamber shield, the first impedance circuit having a first resistor and a first capacitor connected in series; and
a second impedance circuit coupled between the substrate and a susceptor, the second impedance circuit having a second resistor separate from the first resistor and a second capacitor separate from the first capacitor.

2. The plasma apparatus as claimed in claim 1, wherein said first resistor is coupled to the chamber shield and the first capacitor, and the first capacitor is coupled to ground.

3. The plasma apparatus as claimed in claim 1, wherein said second resistor and said second capacitor are connected in series.

4. The plasma apparatus as claimed in claim 3 wherein said second resistor is coupled to the substrate and the second capacitor, and the second capacitor is coupled to ground.

5. The plasma apparatus as claimed in claim 1, further comprising a DC power source and an RF power source coupled to said sputtering target.

6. The plasma apparatus of claim 1, wherein the first resistor is coupled to the chamber shield.

7. The plasma apparatus of claim 1, further comprising a third impedance circuit coupled between the sputtering target and ground, the third impedance circuit separate from the first impedance circuit and the second impedance circuit.

8. The plasma apparatus of claim 7, wherein the third impedance circuit comprises a third resistor separate from the first resistor and the second resistor and a third capacitor separate from the first capacitor and the second capacitor.

9. The plasma apparatus of claim 8, wherein the third resistor and the third capacitor are connected in series.

10. The plasma apparatus of claim 1, further comprising a matching circuit coupled to the chamber, the matching circuit comprising a stepped inductor and a first tuning capacitor.

11. The plasma apparatus of claim 10, wherein the matching circuit further comprises a fourth capacitor coupled with the first tuning capacitor.

12. The plasma apparatus of claim 11, wherein the fourth capacitor and the first tuning capacitor are connected in parallel.

13. The plasma apparatus of claim 12, further comprising a low pass filter coupled with the chamber, the low pass filter comprising a second tuning capacitor separate from the first tuning capacitor and an RF choke.

14. The plasma apparatus of claim 1, wherein the second resistor is coupled to said substrate.

15. The plasma apparatus of claim 14, wherein the first resistor is coupled to said chamber shield.

16. The plasma apparatus of claim 15, wherein the second capacitor is coupled to ground.

17. The plasma apparatus of claim 16, wherein the first capacitor is coupled to ground.

18. The plasma apparatus of claim 17, further comprising a third impedance circuit coupled between the sputtering target and ground, the third impedance circuit separate from the first impedance circuit and the second impedance circuit.

19. The plasma apparatus of claim 18, wherein the third impedance circuit comprises a third resistor separate from the first resistor and the second resistor and a third capacitor separate from the first capacitor and the second capacitor.

* * * * *